United States Patent
Yang et al.

(12)

(10) Patent No.: US 6,731,130 B1
(45) Date of Patent: May 4, 2004

(54) METHOD OF DETERMINING GATE OXIDE THICKNESS OF AN OPERATIONAL MOSFET

(75) Inventors: Nian Yang, San Jose, CA (US); Zhigang Wang, San Jose, CA (US); Tien-Chun Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 47 days.

(21) Appl. No.: 10/017,832

(22) Filed: Dec. 12, 2001

(51) Int. Cl.[7] .................. G01R 31/26; G01R 27/08; G01N 27/00
(52) U.S. Cl. .................. 324/766; 324/716; 324/769; 324/71.5
(58) Field of Search .................. 324/71.1, 71.5, 324/716, 719, 765, 766, 769; 438/14, 17, 18

(56) References Cited

U.S. PATENT DOCUMENTS

| 5,798,649 A | * | 8/1998 | Smayling et al. ............ 324/551 |
| 6,188,234 B1 | * | 2/2001 | Abadeer et al. ............ 324/766 |
| 6,538,462 B1 | * | 3/2003 | Lagowski et al. .......... 324/765 |

* cited by examiner

*Primary Examiner*—Evan Pert
*Assistant Examiner*—Russell M. Kobert

(57) ABSTRACT

A non-destructive and non-intrusive, user friendly, easy to setup and efficient system and method of determining the gate oxide thickness of an operational MOSFET used in real circuit applications is provided. Additionally, the present invention determines the gate oxide thickness when the operational MOSFET is operating in the inversion mode.

9 Claims, 5 Drawing Sheets

300

Ground the drain and source nodes of the operational NMOSFET
310

↓

Apply a range of voltages at the gate node and measure the gate direct tunneling current at each applied voltage
320

↓

Provide a gate direct tunneling current model
330

↓

Determine the gate oxide thickness by fitting the gate direct tunneling model to the measured data and using a gate oxide thickness variable as a fitting parameter
340

US 6,731,130 B1

METHOD OF DETERMINING GATE OXIDE THICKNESS OF AN OPERATIONAL MOSFET

BACKGROUND OF THE INVENTION

1. Field of the Invention

The present invention generally relates to MOSFETS (metal oxide semiconductor field effect transistors). More particularly, the present invention relates to the field of determining the gate oxide thickness of a MOSFET.

2. Related Art

As the scaling of metal oxide semiconductor field effect transistor (MOSFET) devices approaches deep submicron dimensions (such as channel lengths of 0.10 micrometers currently being developed), the gate oxide thickness scales aggressively into sub-3 nm (nanometers) accordingly. The n-type MOSFET (or NMOSFET) is formed on a p-type substrate. The p-type MOSFET (or PMOSFET) is formed on an n-type substrate. As one of the most critical parameters of the MOSFET, the gate oxide thickness has to be measured accurately to properly use the MOSFET in integrated circuits. Although the MOSFET typically operates in the inversion mode in circuit applications rather than in accumulation mode or depletion mode, the gate oxide thickness is typically measured when the MOSFET is operating in a mode other than the inversion mode.

One conventional technique for determining the gate oxide thickness utilizes ellipsometry and an ellipsometer. According to this technique, a test wafer that has undergone a portion of the fabrication process is provided to the ellipsometer to determine the gate oxide thickness. Unfortunately, this technique is not very accurate when measuring ultra thin gate oxides in the sub-3 nm range. Moreover, this sate oxide thickness measurement does not represent the gate oxide thickness of an actual operational MOSFET that can be used in real circuit applications. Also, this technique is generally destructive with respect to the MOSFET structure.

In addition, a conventional capacitor-voltage (C-V) measurement is utilized to determine the gate oxide thickness, According to this technique, a series of gate voltages are applied to a test MOSFET device and a corresponding capacitance is measured to determine the gate oxide thickness, whereas the test MOSFET device has dimensions (e.g., channel length of 100 micrometers and channel width of 100 micrometers) significantly greater than the dimensions (e.g., channel length of 0.5 micrometers and channel width of 5 micrometers) of an operational MOSFET used in real circuit applications. Unfortunately, this technique is not very reliable for measuring ultra thin gate oxides in the sub-3 nm range for MOSFETS operated in the inversion mode due to large gate direct tunneling currents (which are exponentially dependent on the scaling down of the gate oxide thickness) and the need for a large MOSFET device which cannot sustain formation of the inversion layer during inversion mode operation.

What is needed is a non-destructive system and method of determining the gate oxide thickness of an operational MOSFET used in real circuit applications. Moreover, what is needed is a system and method for determining the gate oxide thickness when the operational MOSFET is operating in the inversion mode.

SUMMARY OF THE INVENTION

A non-destructive system and method of determining the gate oxide thickness of an operational MOSFET used in real circuit applications is provided. Additionally, the present invention determines the gate oxide thickness when the operational MOSFET is operating in the inversion mode.

According to one method of the present invention of determining the gate oxide thickness of an operational MOSFET, an operational NMOSFET fabricated with a gate oxide formation process is prepared for data measurements. An example of a gate oxide formation process is rapid thermal oxidation which is used to form ultra thin oxides. However, the invention is applicable to MOSFETS fabricated with any other gate oxide formation process. In particular, the drain node and the source node of the operational NMOSFET are coupled to a ground. Then, a range of positive voltages is applied at the gate node of the operational NMOSFET to place the operational NMOSFET in the inversion mode (which is the typical operation node of an operational MOSFET in a real circuit application). For each applied voltage, a gate direct tunneling current is measured at the gate node to generate a plurality of measured data. Continuing, the gate oxide thickness of the operational NMOSFET is determined efficiently by the present embodiment by fitting a gate direct tunneling current model to the measured data and using a gate oxide thickness variable as a fitting parameter.

These and other advantages of the present invention will no doubt become apparent to those of ordinary skill in the art after having read the following detailed description of the preferred embodiments, which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the present invention.

The drawings referred to in this description should not be understood as being drawn to scale except if specifically noted.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
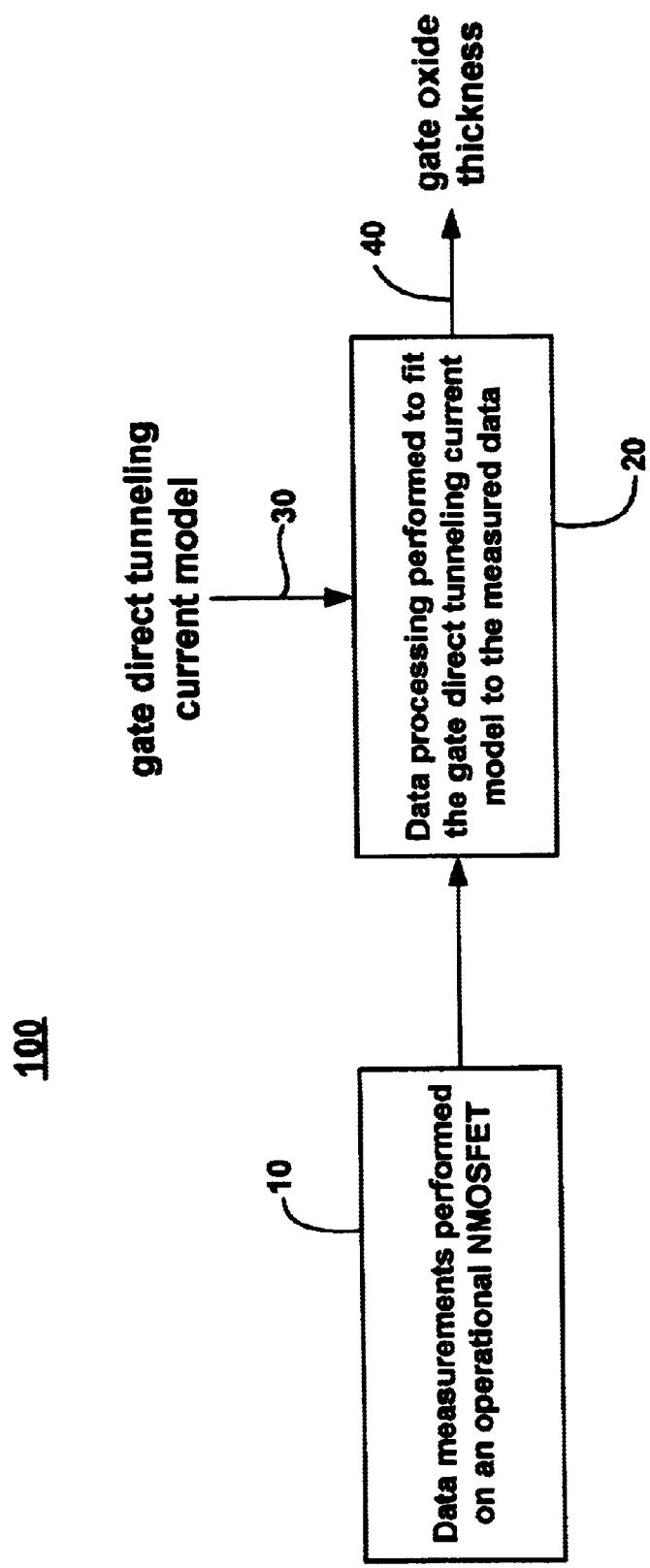
FIG. 1 illustrates a block diagram for a system for determining a gate oxide thickness of an operational MOSFET in accordance with an embodiment of the present invention.

FIG. 1 illustrates a block diagram for a system 100 for determining a gate oxide thickness of an operational MOSFET in accordance with an embodiment of the present invention. It should be understood that the term gate oxide refers to silicon oxide, silicon oxynitride, or any other high-k dielectric used in MOSFET fabrication. The present invention provides a non-destructive system and method of determining the gate oxide thickness of an operational MOSFET used in real circuit applications. Additionally, in the present embodiment, the gate oxide thickness is determined when the operational MOSFET is operating in the inversion mode. Since the MOSFET typically operates in the inversion mode in real circuit applications rather than in accumulation mode or depletion mode, it is preferable to measure the gate oxide thickness when the MOSFET is operating in the inversion mode. In practice, one is more interested in the gate oxide thickness of operational MOSFETS, which are MOSFETS that have practical, in particular small, dimensions and structure and are used in real circuit applications. The present invention provides a method and system to determine accurately the gate oxide thickness of small MOSFETS that have ultra thin gate oxides (e.g., less than approximately 3 nm) and are used in real circuit applications.

In particular, the system 100 and method of determining the gate oxide thickness of the operational MOSFET relies on accurate gate direct tunneling current measurements performed on an operational NMOSFET (which has small dimensions and structure and is used in real circuit applications) (10). The system 100 of the present embodiment further determines the gate oxide thickness of the operational NMOSFET operated in the inversion mode. Furthermore, the system 100 and method of determining the gate oxide thickness of the operational MOSFET relies on a well-developed gate direct tunneling current model (30), and an accurate data processor (20) to determine the gate oxide thickness (40) by fitting the gate direct tunneling current model (30) to the gate direct tunneling current measurements and using a gate oxide thickness variable as a fitting parameter. The data processor 20 can be implemented as a computer or in any other manner.

According to the system 100 and method of determining the gate oxide thickness of an operational MOSFET of the present invention, at 10 an operational NMOSFET fabricated with a gate oxide formation process is prepared for data measurements. An example of a gate oxide formation process is rapid thermal oxidation which is used to form ultra thin oxides. However, the invention is applicable to MOSFETS fabricated with any other gate oxide formation process. In particular, the drain node and the source node of the operational NMOSFET are coupled to a ground. Then, a range of positive voltages is applied at the gate node of the operational NMOSFET to place the operational NMOSFET in the inversion mode (which is the typical operation node of an operational MOSFET in a real circuit application). For each applied voltage, a gate direct tunneling current is measured at the gate node to generate a plurality of measured data. Continuing at 20, the gate oxide thickness 40 of the operational NMOSFET is determined efficiently by fitting a gate direct tunneling current model 30 to the measured data and using a gate oxide thickness variable as a fitting parameter. The gate oxide thickness of an operational PMOSFET, fabricated with the identical gate oxide formation process used with the operational NMOSFET, would typically exhibit the same gate oxide thickness characteristics as the operational NMOSFET. That is, the present invention is not limited solely to use with NMOSFETS.

The gate direct tunneling current model 30 has been developed based on a unique and self converging algorithm by performing Poisson's equation and quantum mechanical calculations of the substrate inversion layer characteristics and transmission of the inversion layer carrier (or electrons) through the gate oxide from the substrate inversion layer, as will be described below.

Figure 2A:
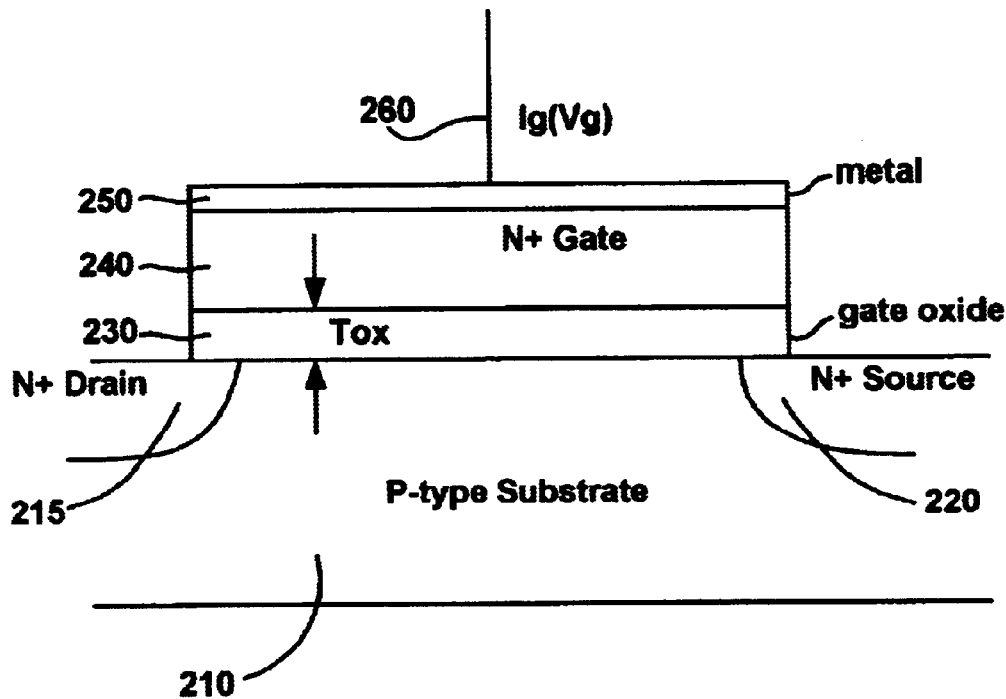
FIG. 2A illustrates an exemplary operational NMOSFET structure on which the present invention can be practiced.

FIG. 2A illustrates an exemplary operational NMOSFET structure 200 on which the present invention can be practiced. The exemplary operational NMOSFET structure 200 includes a p-type substrate 210, a heavily n-type doped drain node 215, a heavily n-type doped source node 220, a gate oxide 230 typically comprised of silicon dioxide, a gate node 240 typically comprised of n-type doped polysilicon, a metal layer 250, and a gate terminal 260 coupled to the metal layer 250 which is coupled to the gate node 240. As will be described below, the gate terminal 260 will be utilized to measure the gate direct tunneling current $I_g$, which is dependent on the applied voltage $V_g$ to the gate node 240. The NMOSFET structure 200 represents the most widely used and well-defined transistor in practice.

The exemplary operational NMOSFET structure 200 may have any dimensions (e.g., channel length is no less than 0.5 micrometers, channel length is no greater than 0.5 micrometers, channel width is no less than 5 micrometers, channel width is no greater than 5 micrometers, gate oxide thickness $t_{ox}$ is no less than 3 nanometers, gate oxide thickness $t_{ox}$ is no greater than 3 nanometers, or any combination thereof). In particular, the present invention enables the accurate determination of gate oxide thickness $t_{ox}$ of the exemplary operational NMOSFET structure 200 whether its dimensions are large, small, or very small for any practical and useful real circuit application. That is, the present invention unlike prior approaches is not limited to measuring and determining a gate oxide thickness that is no less than approximately 3 nm.

Figure 2B:
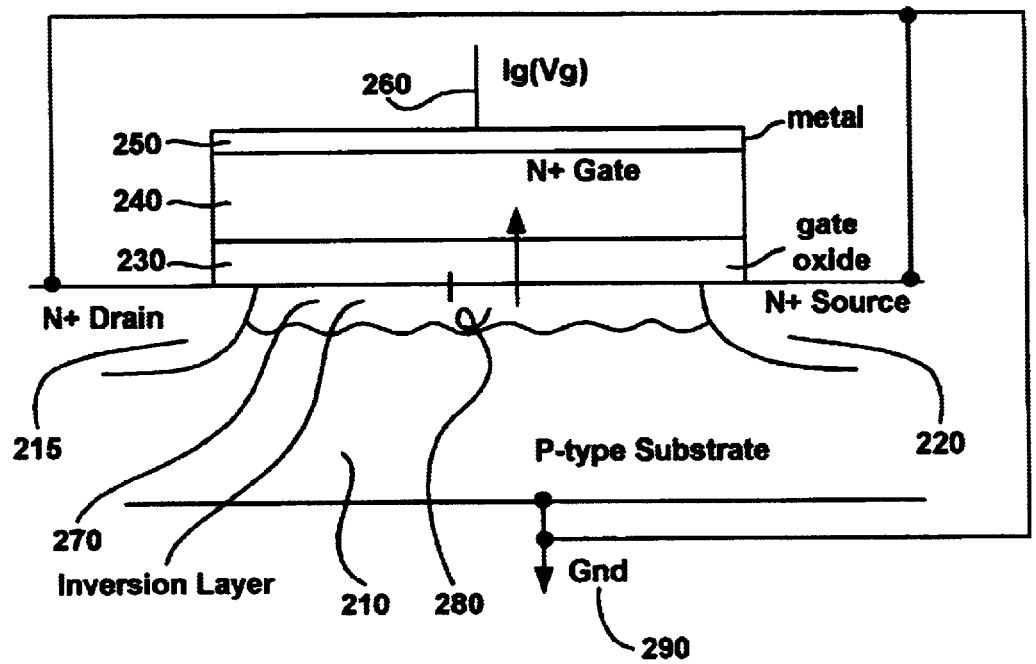
FIG. 2B illustrates the exemplary operational NMOSFET structure of FIG. 2A showing the data measurement setup in accordance with an embodiment of the present invention.

FIG. 2B illustrates the exemplary operational NMOSFET structure 200 of FIG. 2A, showing the data measurement setup in accordance with an embodiment of the present invention. As illustrated in FIG. 2B, the drain node 215 and the source node 220 are coupled to ground 290. Typically, the p-type substrate 210 is also coupled to ground 290. By grounding the drain node 215 and the source node 220 and by applying a range of voltages $V_g$ at the gate node 240, the exemplary operational NMOSFET structure 200 can be operated in the inversion mode (which is the typical operation node of an operational MOSFET in a real circuit application).

In the inversion mode, a substrate inversion layer 270 is formed. Moreover, the inversion carriers (or electrons) 280 in the substrate inversion layer 270 directly tunnel from the substrate inversion layer 270 through the gate oxide 230 to the gate node 240 since the electrons 280 have the appropriate energy level at the applied voltage $V_g$. The gate direct tunneling current $I_g$, which is measured at the gate terminal 260, is dependent on the applied voltage $V_g$ to the gate node 240 and is caused by the electrons 280 directly tunneling from the substrate inversion layer 270 through the gate oxide 230 to the gate node 240. In particular, the grounded drain and source nodes 215 and 220 provide sufficient inversion carriers (or electrons) to form and maintain the substrate inversion layer despite the gate direct tunneling current $I_g$.

Figure 3:
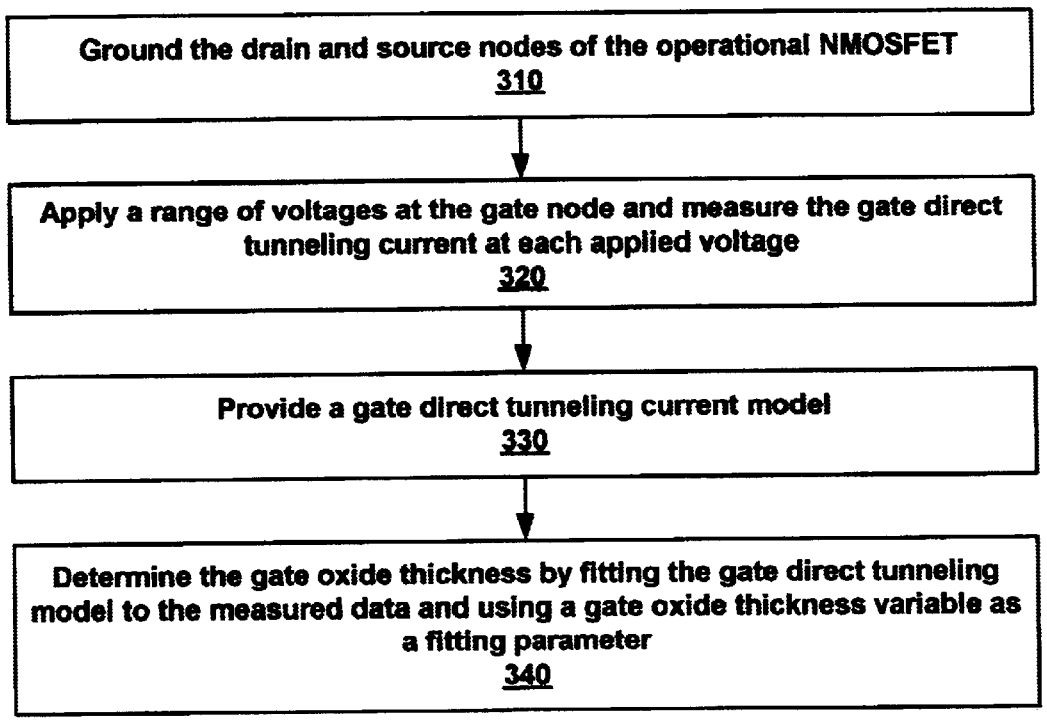
FIG. 3 illustrates a flow chart showing a method of determining a gate oxide thickness of an operational MOSFET in accordance with an embodiment of the present invention.

FIG. 3 illustrates a flow chart showing a method 300 of determining a gate oxide thickness of an operational MOSFET fabricated with a gate oxide formation process in accordance with an embodiment of the present invention. Reference is made to FIG. 2B. It should be understood that the term gate oxide refers to silicon oxide, silicon oxynitride, or any other high-k dielectric used in MOSFET fabrication. Since the gate oxide thickness $t_{ox}$ of an operational PMOSFET, fabricated with the identical gate oxide formation process used with the operational NMOSFET in any real fabrication processes, would typically exhibit the same gate oxide thickness characteristics as the operational NMOSFET, for characterization of the operational PMOSFET and NMOSFET devices it is sufficient to accurately determine the gate oxide thickness $t_{ox}$ of the operational NMOSFET.

At Block 310, the drain and source nodes 215 and 220 of the operational NMOSFET 200 are coupled to ground 290. At Block 320, a range of voltages $V_g$ is applied at the gate node 240. By grounding the drain node 215 and the source node 220 and by applying a range of voltages $V_g$ at the gate node 240, the operational NMOSFET 200 can be operated in the inversion mode (which is the typical operation node of an operational MOSFET in a real circuit application). Moreover, for each applied voltage $V_g$, the gate direct tunneling current $I_g$ is measured at the gate terminal 260 to generate a plurality of measured data representing the measured gate direct tunneling current $I_g$ at the applied voltage $V_g$.

Moreover, at Block 330, the gate direct tunneling current model is provided to a data processor (e.g., a computer). As described above, the gate direct tunneling current model has been developed based on the combined solution of Poisson's equation and quantum mechanical calculations of the substrate inversion layer 270 characteristics and transmission of the inversion layer carrier (or electrons) 280 through the gate oxide 230 from the substrate inversion layer 270. The uniqueness of the modeling algorithm is that an iterative and self-converging approach is devised, enabling the accurate and efficient gate tunnel current modeling using quantum mechanical theory. For the thin oxide, quantum mechanical theory is used with Poisson's equation. Since most conventional techniques, such as C-V measurements, do not involve quantum mechanical theory, use of these conventional techniques leads to large inaccuracy in the measured gate oxide thickness $t_{ox}$. In particular, the gate direct tunneling current model for describing the gate direct tunneling current $I_g$ includes a gate oxide thickness $t_{ox}$ variable, an applied voltage $V_g$ variable, and a value representing reflectivity of an electron from the substrate inversion layer due to the gate oxide energy barrier.

Continuing at Block 340, the actual gate oxide thickness is efficiently determined by fitting the gate direct tunneling current model to the measured data and using the gate oxide thickness variable $t_{ox}$ as a fitting parameter. A nonlinear regression technique based on least square fitting may be utilized. The modeling algorithm and this nonlinear regression technique can be integrated to form an efficient and novel gate oxide thickness $t_{ox}$ measurement system.

Figure 4:
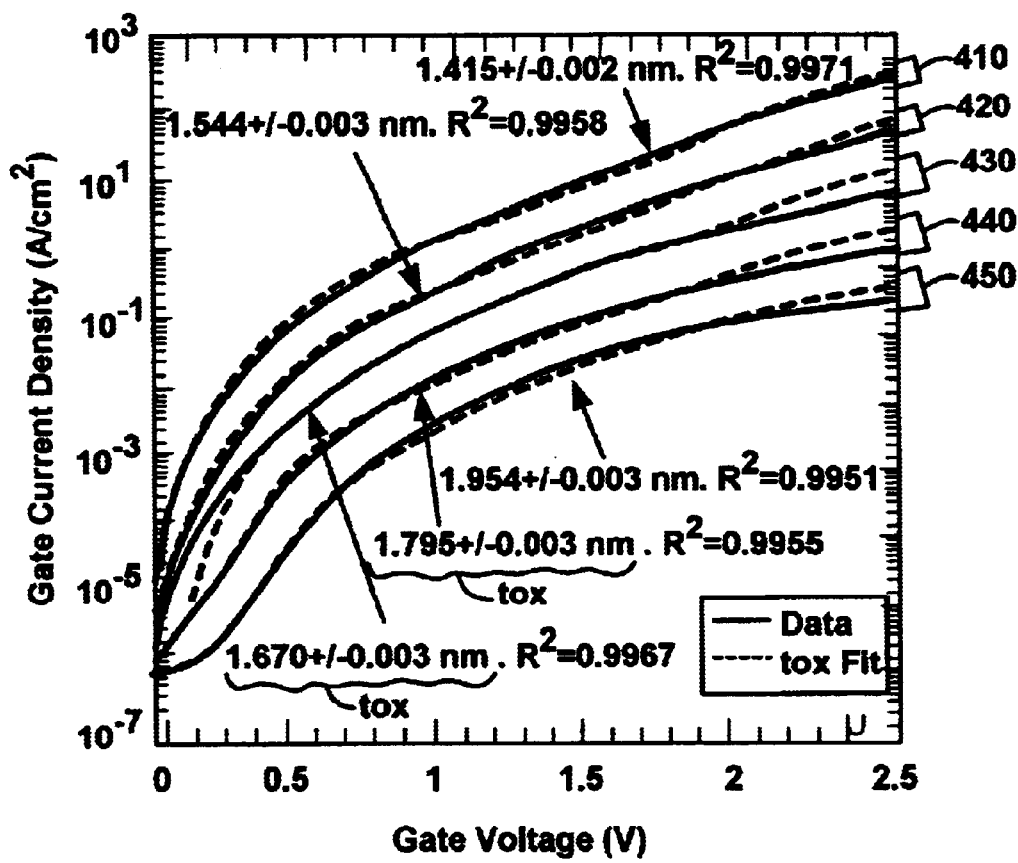
FIG. 4 illustrates a graph showing multiple pairs of curves, each pair having a first curve representing measured data associated with a gate oxide thickness and a second curve representing a gate direct tunneling current model fitted to the measured data.

FIG. 4 illustrates a graph 400 showing multiple pairs of curves 410–450, each pair having a first curve (solid line) representing measured data obtained through the setup of FIG. 2B and associated with the gate oxide thickness of the operational NMOSFET and a second curve (broken line) representing a gate direct tunneling current model fitted to the measured data. The gate direct tunneling current density is plotted on the vertical scale while the applied voltage $V_g$ at the gate node is plotted on the horizontal scale. Therefore, as discussed earlier, the invention is applicable to a wide range of MOSFET device dimensions, large or small, since the gate direct tunneling current density is used here rather than the gate direct tunneling current itself, whereas the gate direct tunneling current density={(gate direct tunneling current)/(area of the MOSFET)}. In VSLI circuits, MOSFETS of different sizes may be used. In particular, the pair of curves 410 corresponds to the gate oxide thickness $t_{ox}$ having the value 1.415+/−0.002 nm, whereas $R^2=0.9971$ represents the chi square value, i.e., the quality of the fit. The closer to 1 is the chi square value, the better. The $R^2=0.9971$ value means that there is only 0.3% uncertainty.

The pair of curves 420 corresponds to the gate oxide thickness $t_{ox}$ having the value 1.544+/−0.003 nm, whereas $R^2=0.9958$ represents the chi square value. The pair of curves 430 corresponds to the gate oxide thickness $t_{ox}$ having the value 1.670+/−0.003 nm, whereas $R^2=0.9967$ represents the chi square value. The pair of curves 440 corresponds to the gate oxide thickness $t_{ox}$ having the value 1.795+/−0.003 nm, whereas $R^2=0.9955$ represents the chi square value. The pair of curves 450 corresponds to the gate oxide thickness $t_{ox}$ having the value 1.954+/−0.003 nm, whereas $R^2=0.9951$ represents the chi square value. As depicted in FIG. 4, by using the gate oxide thickness $t_{ox}$ variable as a fitting parameter, the gate oxide thickness $t_{ox}$ can be efficiently determined after the measured gate direct tunneling current data is compared with the gate direct tunneling current model via a nonlinear least square fitting method.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of determining a gate oxide thickness of an operational MOSFET (metal oxide semiconductor field effect transistor) fabricated with a gate oxide formation process, comprising:
   a) providing said operational MOSFET fabricated with said gate oxide formation process;
   b) coupling a drain node and a source node of said operational MOSFET to a ground;
   c) applying a range of voltages at a gate node of said operational MOSFET and measuring at said gate node a gate direct tunneling current for each applied voltage to generate a plurality of measured data;
   d) providing a gate direct tunneling current model; and
   e) determining said gate oxide thickness by fitting said gate direct tunneling current model to said measured data and using a gate oxide thickness variable as a fitting parameter.

2. A method as recited in claim 1 wherein said gate oxide thickness is no less than approximately 3 nanometers.

3. A method as recited in claim 1 wherein said gate oxide thickness is no greater than approximately 3 nanometers.

4. A method as recited in claim 1 wherein a channel length of said operational MOSFET is no less than approximately 0.5 micrometers.

5. A method as recited in claim 1 wherein a channel length of said operational MOSFET is no greater than approximately 0.5 micrometers.

6. A method as recited in claim 1 wherein a channel width of said operational MOSFET is no less than approximately 5 micrometers.

7. A method as recited in claim 1 wherein a channel width of said operational MOSFET is no greater than approximately 5 micrometers.

8. A method as recited in claim 1 wherein in said step c) said operational MOSFET is operated in an inversion mode by application of a particular range of voltages at said gate node.

9. A method as recited in claim 1 wherein said gate direct tunneling current model includes a value representing reflectivity of an electron from an inversion layer due to a gate oxide energy barrier.

* * * * *